United States Patent
Javre et al.

(10) Patent No.: US 9,543,934 B1
(45) Date of Patent: Jan. 10, 2017

(54) DETERMINATION OF CONFIGURATION VALUES AND CONFIGURATION OF FREQUENCY MULTIPLIER AND FREQUENCY DIVIDER CIRCUITRY

(71) Applicant: Xilinx, Inc., San Jose, CA (US)

(72) Inventors: Somdutt Javre, Seoni (IN); Pradeep Kumar Mishra, Hyderabad (IN); Gangadhar Budde, Tq. Renapur (IN); Siddharth Rele, Navi Mumbai (IN)

(73) Assignee: XILINX, INC., San Jose, CA (US)

( * ) Notice: Subject to any disclaimer, the term of this patent is extended or adjusted under 35 U.S.C. 154(b) by 118 days.

(21) Appl. No.: 14/682,758

(22) Filed: Apr. 9, 2015

(51) Int. Cl.
| | |
|---|---|
| *G06F 1/10* | (2006.01) |
| *H03K 5/00* | (2006.01) |
| *H03L 7/18* | (2006.01) |
| *G06F 1/08* | (2006.01) |
| *G06F 1/04* | (2006.01) |
| *G06F 1/06* | (2006.01) |

(52) U.S. Cl.
CPC ............ *H03K 5/00006* (2013.01); *G06F 1/08* (2013.01); *H03L 7/18* (2013.01); *G06F 1/04* (2013.01); *G06F 1/06* (2013.01); *G06F 1/10* (2013.01)

(58) Field of Classification Search
None
See application file for complete search history.

(56) References Cited

U.S. PATENT DOCUMENTS

| | | | | |
|---|---|---|---|---|
| 6,425,089 | B1* | 7/2002 | Tsai ......................... | G06F 1/04 327/291 |
| 2005/0248380 | A1* | 11/2005 | Kaizuka ................ | H03L 7/1974 327/291 |
| 2009/0174441 | A1* | 7/2009 | Gebara ................. | H02M 3/073 327/115 |
| 2014/0340130 | A1* | 11/2014 | Machnicki ............... | G06F 1/04 327/115 |
| 2015/0301557 | A1* | 10/2015 | Walker ..................... | G06F 1/10 375/376 |
| 2016/0080008 | A1* | 3/2016 | Novellini ................. | G06F 1/10 375/296 |

* cited by examiner

*Primary Examiner* — Tuan T Lam
(74) *Attorney, Agent, or Firm* — LeRoy D. Maunu

(57) ABSTRACT

In an approach for determining multiplier values and divisor values for programming frequency multiplier and divider circuits in a clock network, respective requested frequency values and respective tolerance levels relative to the requested frequency values for a plurality of clocked circuit blocks are used. Multiple solution sets are generated, with each solution set including a multiplier value and an associated set of values of divisors, such that resulting actual frequencies satisfy the respective tolerance levels. Respective sets of clocked error values are determined for the plurality of solution sets, with each clocked error value corresponding to a clocked circuit block. Solution-set-error values are determined as a function of the respective sets of clocked error values, and the solution set having the least solution-set-error value is selected and stored.

20 Claims, 4 Drawing Sheets

DETERMINATION OF CONFIGURATION VALUES AND CONFIGURATION OF FREQUENCY MULTIPLIER AND FREQUENCY DIVIDER CIRCUITRY

TECHNICAL FIELD

The disclosure generally relates to determining configuration values for frequency multiplier and frequency divider circuitry that provide clock signals to clocked circuit blocks.

BACKGROUND

A System on Chip (SOC) is an integrated circuit in which all components of an electronic system, such as a computer system, are integrated on a single semiconductor die. For example, an SOC may include one or more processors, RAM, and input/out (I/O) interfaces for off-chip communication. Some SOCs may further include programmable logic and routing resources such as those found in field programmable gate arrays (FPGAs).

The major components, which are referred to herein as "circuit blocks," of an SOC may operate at different clock speeds. For example, the processor, memory, and I/O interfaces may be rated to operate at different frequencies. There may be twenty or more circuit blocks on some SOCs, with each circuit block requiring a different clock speed.

In some SOCs, the clock signal from an oscillator and a master phase locked loop (PLL) is delivered to the circuit blocks through a clock network having programmable frequency dividers. A programmable frequency multiplier may be configured to boost the oscillator frequency to a rate greater than or equal to the greatest frequency required by one of the circuit blocks, and the frequency dividers may be configured to reduce the boosted frequency to rates required by the circuit blocks.

Determining a suitable set of values for configuring the frequency multiplier and the frequency dividers may be problematic, because there may be a large number of circuit blocks and numerous possible combinations of configuration values for the frequency multiplier and frequency dividers. The combination of configuration values for the frequency multiplier and frequency dividers may be referred to herein as a "solution set."

A prior approach selected a solution set having the least overall error rate, where the error rate is the sum of the absolute differences between the required frequencies of the circuit blocks and the actual frequencies that would be provided to the circuit blocks using the selected values for the frequency multiplier and dividers. However, a particular solution set may not be feasible in some instances, even though the overall error rate of the solution set may be less than the overall error rate of an alternative solution set. A solution set is not feasible if the configuration values for the frequency multiplier and frequency divider for any one of the circuit blocks would produce a frequency that is unsuitable for that circuit block. In this scenario, a designer may be faced with having to manually determine a suitable solution set, assuming a feasible solution set even exists, or choose another solution set that may be less desirable than some other solution set.

SUMMARY

In one embodiment, a method of determining configuration values for frequency multiplier and frequency divider circuitry includes inputting respective requested frequency values and respective tolerance levels relative to the requested frequency values for a plurality of clocked circuit blocks. Each clocked circuit block has a respective clock input port. A computer processor determines a plurality of solution sets. Each solution set includes a multiplier value and an associated set of values of divisors. Each value of a divisor in each associated set corresponds to one of the clocked circuit blocks. An actual frequency value for the corresponding clocked circuit block is a function of an oscillator frequency, the multiplier value, and the value of the divisor, and the actual frequency satisfies the tolerance level. The method determines respective sets of clocked error values for the plurality of solution sets. Each set of clocked error values includes for each clocked circuit block, a respective clocked error value that is a function of the respective requested frequency value of the clocked circuit block, the oscillator frequency, the multiplier value, and the value of the divisor corresponding to the clocked circuit block. For each solution set, a respective solution-set-error value is determined as a function of the respective sets of clocked error values. The solution set having a respective solution-set-error value that is less than the respective solution-set-error value of each other of the solution sets is selected, and the selected solution set is stored in a computer-readable storage device.

In another embodiment, a method of configuring a programmable integrated circuit (IC) includes inputting respective requested frequency values and respective tolerance levels relative to the requested frequency values for a plurality of clocked circuit blocks. Each clocked circuit block has a respective clock input port. A computer processor determines a plurality of solution sets. Each solution set includes a multiplier value and an associated set of values of divisors. Respective subsets of each set of values of divisors correspond to the clocked circuit blocks, and each subset includes one or more values of one or more corresponding divisors. For each solution set and for each clocked circuit block, an actual frequency value that is a function of an oscillator frequency, the multiplier value, and the respective subset of the one or more values of the one or more corresponding divisors, satisfies the tolerance level. The method determines respective sets of clocked error values for the plurality of solution sets. Each set of clocked error values includes, for each clocked circuit block, a respective clocked error value that is a function of the respective requested frequency value of the clocked circuit block, the oscillator frequency, the multiplier value, and the value of the divisor corresponding to the clocked circuit block. For each solution set, a respective solution-set-error value is determined as a function of the respective clocked error values. The solution set having a respective solution-set-error value that is less than the respective solution-set-error value of each other of the solution sets is selected. A frequency multiplier circuit and frequency divider circuits coupled between an oscillator of the programmable IC and the clocked circuit blocks are configured with the multiplier value and values of the divisors from the selected solution set for providing clock signals to the clock input ports of the clocked circuit blocks.

A system is provided in another embodiment. The system includes a processor and a memory arrangement coupled to the processor. The memory arrangement is configured with instructions that are executable by the processor for performing operations including inputting respective requested frequency values and respective tolerance levels relative to the requested frequency values for a plurality of clocked circuit blocks. Each clocked circuit block has a respective clock input port. The operations determine a plurality of solution sets. Each solution set includes a multiplier value and an associated set of values of divisors. Each value of a divisor in each associated set corresponds to one of the clocked circuit blocks, an actual frequency value for the corresponding clocked circuit block is a function of an oscillator frequency, the multiplier value, and the value of the divisor, and the actual frequency satisfies the tolerance level. The operations determine respective sets of clocked error values for the plurality of solution sets. Each set of clocked error values includes, for each clocked circuit block, a respective clocked error value that is a function of the respective requested frequency value of the clocked circuit block, the oscillator frequency, the multiplier value, and the value of the divisor corresponding to the clocked circuit block. For each solution set, a respective solution-set-error value is determined as a function of the respective sets of clocked error values. The operations select the solution set having a respective solution-set-error value that is less than the respective solution-set-error value of each other of the solution sets. The selected solution set is stored in the memory arrangement.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

Figure 1:
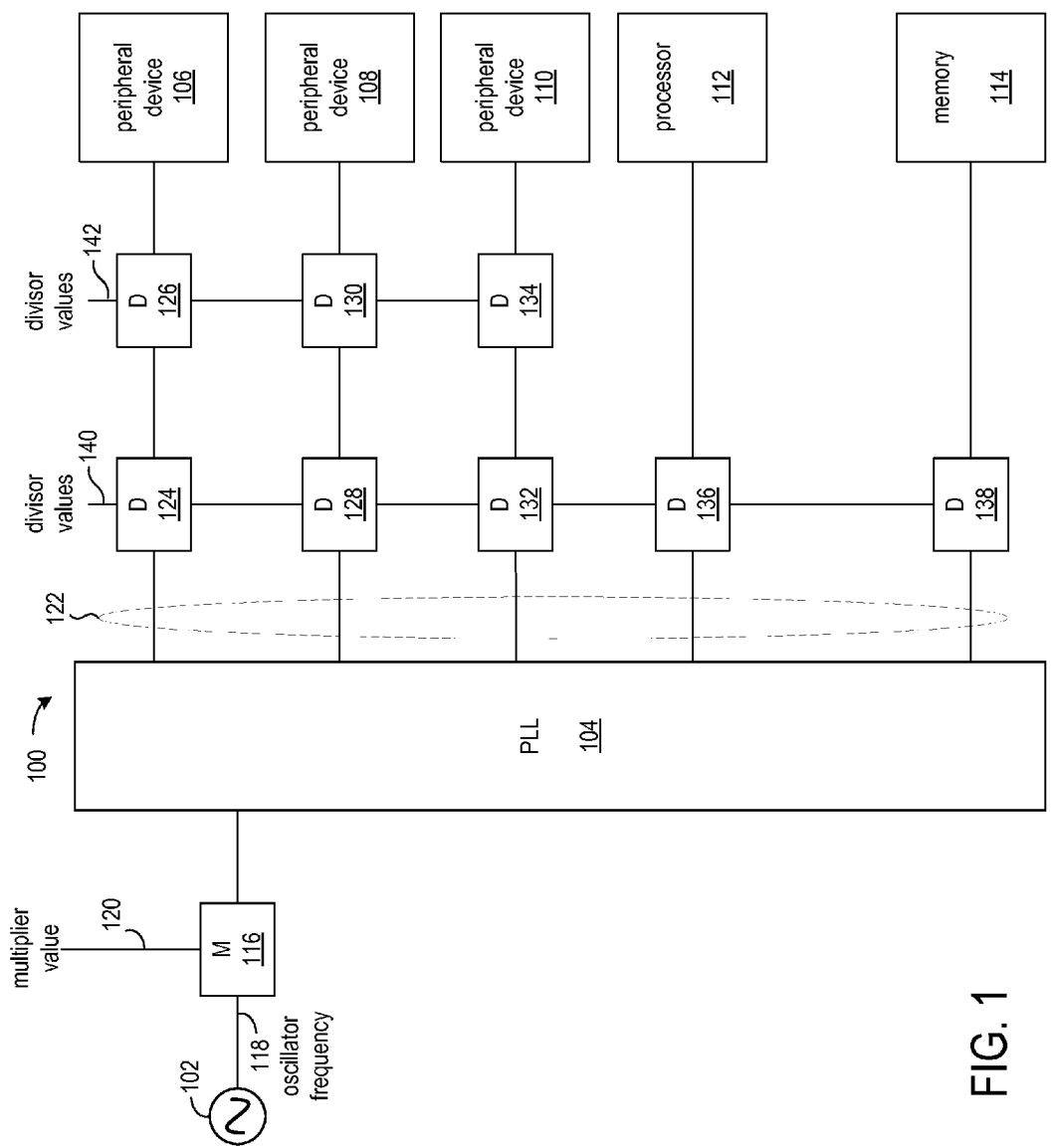
FIG. 1 shows a clock network including examples of circuit blocks having clock signals derived from a master oscillator and phase locked loop (PLL)

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems improve upon prior approaches for determining the configuration values for a frequency multiplier and frequency divider circuits in a clock network. Individual tolerance levels and requested frequency values are input and associated with the circuit blocks that receive the clock signals from the clock network. In considering individual requested frequency values and tolerance levels for the clocked circuit blocks, a wide range of candidate solution sets can be automatically generated, with each candidate solution set having configuration values for the frequency multiplier and divider circuits which produce actual frequencies that are within the associated tolerance levels for the clocked circuit blocks.

Respective solution-set-error values are determined for the candidate solution sets as a function of the error values of the clocked circuit blocks as determined with respect to the multiplier value and divisor values in each candidate solution set. The solution-set-error values thereby provide an indication of which candidate solution set provides clock signal frequencies that are closer to the requested frequency values for the circuit blocks than the clock signal frequencies provided by others of the candidate solution sets. The individual tolerance levels for the clocked circuit blocks prevent candidate solution sets from having divisor values that would result in unsuitable clock frequencies for the clocked circuit blocks, and the individual error values factor the desirability of the divisor values for individual clocked circuit blocks into the selection of one of the candidate solution sets.

The multiplier value and the divisor values from a selected one of the candidate solution sets may be used to configure a frequency multiplier circuit and frequency divider circuits coupled between an oscillator and the clocked circuit blocks.

FIG. 1 shows a clock network 100 including examples of circuit blocks having clock signals derived from a master oscillator 102 and phase locked loop (PLL) 104. The circuit blocks include peripheral devices 106, 108, and 110, a processor 112, and a memory 114. It will be appreciated that an SOC may have many peripheral devices, multiple processor cores, and multiple memory blocks, thereby resulting in a much larger clock network than is shown in FIG. 1.

The oscillator 102 generates a clock signal, which is input to the frequency multiplier circuit 116. The multiplier circuit boosts the frequency of the clock signal such that the frequency of the clock signal provided to the PLL 104 is a multiple of the frequency clock signal from the oscillator. If the frequency of the clock signal 118 output is denoted OSC, and the multiplier value 120 programmed into the multiplier circuit 116 is M, then the frequency of the clock signal output by the multiplier circuit and locked by PLL 104 is OSC*M.

Each circuit block has an associated and respective set of frequency divider circuits, and each set includes one or more divider circuits. The set of divider circuits associated with a circuit block reduces the frequency of the clock signal 122 output by the PLL. The associated set of divider circuits of peripheral device 106 includes divider circuits 124 and 126, the associated set of divider circuits of peripheral device 108 includes divider circuits 128 and 130, the associated set of divider circuits of peripheral device 110 includes divider circuits 132 and 134, the associated set of divider circuits of processor 112 includes divider circuit 136, and the associated set of divider circuits of memory 114 includes divider circuit 138.

The PLL outputs the clock signal 122 having a frequency of OSC*M to the divider circuits, and the respective sets of divider circuits reduce the clock frequency for the clocked circuit blocks by amounts programmed with the divisor values 140 and 142. Divisor values 140 program the divider circuits 124, 128, 132, 136, and 138, and divisor values 142 program the divider circuits 126, 130, and 134. Each frequency divider circuit is individually programmable with a respective divisor value. In an example implementation, the multiplier value 120 and divisor values range from 1 to 63.

The actual frequency of the clock signals provided to the clock input ports of the clocked circuit blocks is a function of the oscillator frequency (OSC), the multiplier value (M), and the respective sets of divisor values associated with the circuit blocks. For a circuit block having one associated frequency divider circuit, the divisor value may be denoted D, and for a circuit block having two associated frequency divider circuits, the divisor values may be denoted D1 and D2.

The actual frequency calculated for a circuit block having one frequency divider is:

actual frequency=($M$*OSC)/$D$

The actual frequency calculated for a circuit block having two frequency dividers is:

actual frequency=($M$*OSC)/($D1$*$D2$)

Figure 2:
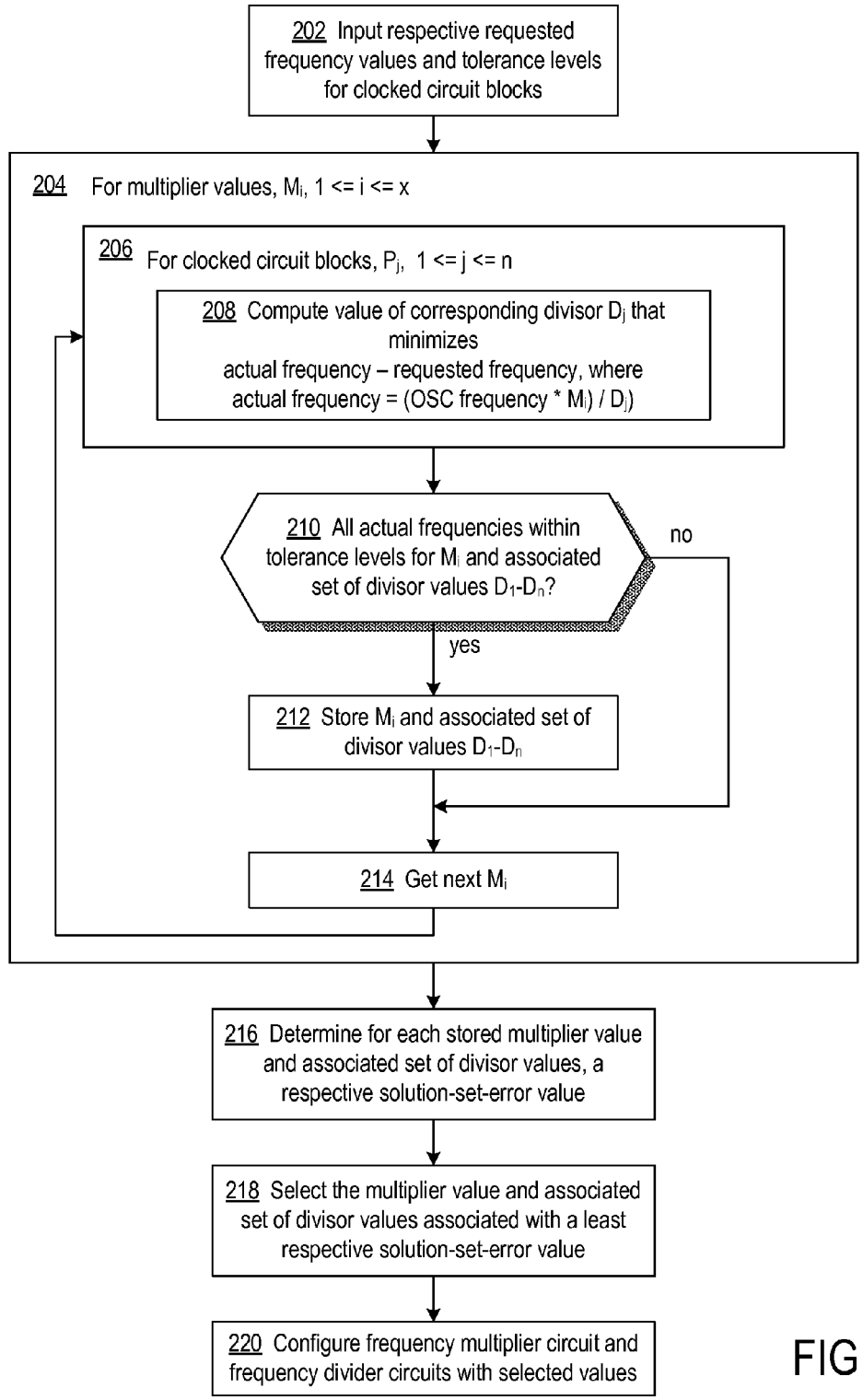
FIG. 2 shows a flowchart of a process for determining a feasible and desirable solution set for configuring the frequency multiplier and the frequency dividers in a clock network.

FIG. 2 shows a flowchart of a process for determining a feasible and desirable solution set for configuring the frequency multiplier and the frequency dividers in a clock network. Before describing the operations shown in the flowchart, an example is presented to illustrate requested frequencies and tolerance levels for four peripheral devices, which are examples of clocked circuit blocks. Table 1 shows the requested frequencies and associated tolerance levels for the four peripheral devices, which include Ethernet, CAN (controller area network), SDIO (secure digital input output), and DBG (debug logic for debugging system on chip).

Table 2 shows examples of candidate solution sets generated in the process of FIG. 2 for the requested frequencies of the peripherals in Table 1. The scenario assumes an oscillator frequency, OSC=33.333 MHz.

TABLE 1

| Peripheral | Requested Frequency | Tolerance |
|---|---|---|
| Ethernet | 125 MHz | 0% |
| CAN | 24 MHz | 2% |
| SDIO | 100 MHz | 1% |
| DBG | 180 MHz | Any |

Respective values for requested frequencies and tolerance levels for the named peripheral devices are shown in Table 1. The requested frequencies and tolerance levels may be input by a system designer to a circuit design tool via a graphical user interface (GUI). The requested frequency for the Ethernet peripheral device is 125 MHz and the associated tolerance level is 0%. That is, the input clock frequency to the Ethernet peripheral device, as adjusted with the frequency multiplier and frequency divider(s), must be exactly 125 MHz. The requested frequency for the CAN peripheral device is 24 MHz and the associated tolerance level is 2% (24 MHz, ±2%). The input clock frequency to the CAN peripheral device, as adjusted with the frequency multiplier and frequency divider(s), can range from 23.52 MHz to 24.48 MHz. The requested frequency for the DBG peripheral device is 180 MHz. However, any input clock frequency is acceptable.

Table 2 shows candidate solution sets generated for the peripheral devices. Each row in Table 2 corresponds to one candidate solution set, and each candidate solution set includes a multiplier value and an associated set of values of divisors.

TABLE 2

| | Ethernet | CAN | SDIO | DBG | SUM |
|---|---|---|---|---|---|
| M1 = 60 MF = 2000 MHz | RF = 125 D = 16 AF = 125 e = 0% | RF = 24 D = 84; AF = 23.81 e = 0.79% | RF = 100 D = 20; AF = 100 e = 0% | RF = 180 D = 11; AF = 181.81 e = 1.001% | 1.79% |
| M2 = 45 MF = 1500 MHz | D = 12 AF = 125 e = 0% | D = 63; AF = 23.81 e = 0.79% | D = 15; AF = 100 e = 0% | D = 8; AF = 181.81 e = 4.1% | 4.89% |
| M3 = 48 MF = 1600 MHz | D = 13; AF = 123.08 e = 1.54% | D = 66; AF = 24.24 e = 1.0% | D = 16; AF = 100 e = 0% | D = 9; AF = 177.77 e = 1.23% | 3.77% |

In the first column, the multiplier values and the clock frequencies resulting from the oscillator frequency and the multiplier values are shown for each candidate solution set. For example, the candidate solution set in the first row has a multiplier value M1=60, and a resulting multiplier frequency (MF)=M1*OSC=60*33.333 MHz=2000 MHz.

The Ethernet column shows the requested frequency (RF), divisor value (D), actual frequency (AF), and error value (e) as determined for the Ethernet peripheral device based on the multiplier frequency (MF) from the first column, the requested frequency, divisor value, and actual frequency. The error value may be computed as follows:

AF=MF/$D$ $e$=((|AF−RF|)/RF)*100%

For the Ethernet peripheral device and the multiplier value=60, the actual frequency (AF)=2000 MHz/16=125 MHz. The error value, e is:

$e$=((125 MHz−125 MHz)/125 Mhz)*100%=0%.

Thus, for the solution set having a multiplier value of 60 and a divisor value of 16 for the Ethernet peripheral device, the multiplier value and divisor value are suitable. Similar calculations for the CAN, DSIO, and DBG peripheral devices show that the multiplier value 60 and respective divisor values 84, 20, and 11 of the solution set in the first row are suitable.

In the solution set shown in the third row, the multiplier value is 48, and for the Ethernet peripheral device and an associated divisor value of 13, the resulting error value is 1.54%. Even though the CAN and SDIO error values of 1.0% and 0% are within the required levels of tolerance, the solution set is not acceptable, because the error value (1.54%) for the Ethernet peripheral device is greater than the tolerance level of 0%.

The last column in Table 2 is a sum of the respective error values (expressed as percentages) determined for the peripheral devices. The solution set having the multiplier value 60 has the lowest total error of 1.79%, and the respective error values are within the respective tolerance levels established for the peripheral devices. Thus, the solution set in the first row provides a better set of configuration values than the solution sets in the second and third rows. Note that even though the solution set in the third row has a lesser total error (3.77%) than the total error of the solution set in the second row (4.89%), the solution set in the third row is not suitable because the error value (1.54%) of the Ethernet peripheral is beyond the established tolerance level (0%). Though only three candidate solution sets are shown, many additional candidate solution sets would be considered where there is a range of multiplier values, many more than four circuit blocks, and a range of divisor values.

Turning now to FIG. 2, at block 202, respective requested frequency values and respective tolerance levels are input for the clocked circuit blocks. An oscillator frequency or frequency range for the oscillator may also be input. The values and levels may be input via a GUI of a circuit design tool, for example.

Candidate solution sets are generated in block 204. The process of block 204 performs the indicated operations for each of the possible/candidate multiplier values of Mi, where 1≤i≤x, and x is implementation dependent. The process of block 204 may iterate through a range of multiplier values. At block 206, values of divisors are computed for the frequency divider circuits associated with the clocked circuit blocks. For ease of explanation, a single frequency divider circuit is assumed for each clocked circuit block. The divisor value selected for a frequency divider at block 208 is one that minimizes the difference (absolute difference) between the requested frequency and the actual frequency, where the actual frequency is a function of the oscillator frequency, the current multiplier value, and the divisor value. As indicated above, the actual frequency may be computed as:

$$AF=(OSC*Mi)/Dj$$

The selected divisor value for a clocked circuit block is the divisor value that results in the absolute difference between the actual frequency and the requested frequency being less than the absolute difference between the actual frequency and the requested frequency for other divisor values. The operation of block 208 may iterate through a range of possible/candidate divisor values until the absolute difference between the actual frequency and the requested frequency begins to increase. When the absolute difference between the actual frequency and the requested frequency begins to increase relative to a previous divisor value, the previous divisor value may be selected for the clocked circuit block in the candidate solution set. Once the divisor value has been selected for the frequency divider of circuit block Pj, the operation of block 208 is repeated to determine a divisor value for circuit block Pj+1. When complete, the output of block 206 is a candidate solution set having the multiplier value Mi and an associated set of values of divisors for the circuit blocks.

For a clocked circuit block having two frequency divider circuits, the process of block 208 may be adapted to determine the two divisor values that minimize the absolute difference between the actual frequency and the requested frequency, where the actual frequency is computed as:

$$AF=(OSC*Mi)/(Dj1*Dj2)$$

where Dj1 is the value of one of the divisors, and Dj2 is the value of the other one of the divisors.

At decision block 210, the process determines whether or not the candidate solution set is feasible. To be a feasible candidate solution set, the actual frequencies to all the clocked circuit blocks must be within the respective tolerance levels. That is, in a feasible candidate solution set, the multiplier value and respective set of divisor values would produce actual frequencies that are all within the respective tolerance levels for the clocked circuit blocks.

If the candidate solution set is feasible, the candidate solution set is stored in memory at block 212. Otherwise, the candidate solution set is discarded. At block 214, the next value of Mi is obtained, and the process returns to block 206 to generate another candidate solution set.

Once candidate solution sets have been generated and evaluated for all multiplier values Mi, the process continues at block 216. At block 216, a solution-set-error value is determined for each of the candidate solution sets stored at block 212. Each solution-set-error value is a function of the respective set of clocked error values determined for the solution set. Each set of clocked error values includes a respective clocked error value for each clocked circuit block. Each clocked error value is a function of the respective requested frequency value of the clocked circuit block, the oscillator frequency, the multiplier value, and the value of the divisor corresponding to the clocked circuit block. The solution-set-error value is a sum of the respective error values (expressed as percentages) determined for the clocked circuit blocks, where the error value, e, of a circuit block is: $e=((|AF-RF|)/RF)*100\%$, as described above.

At block 218, the candidate solution set having the least solution-set-error value is selected and stored in a computer readable storage device, and at block 220, the multiplier value and the associated set of divisor values are used to configure the frequency multiplier and frequency divider circuits in the clock network.

Figure 3:
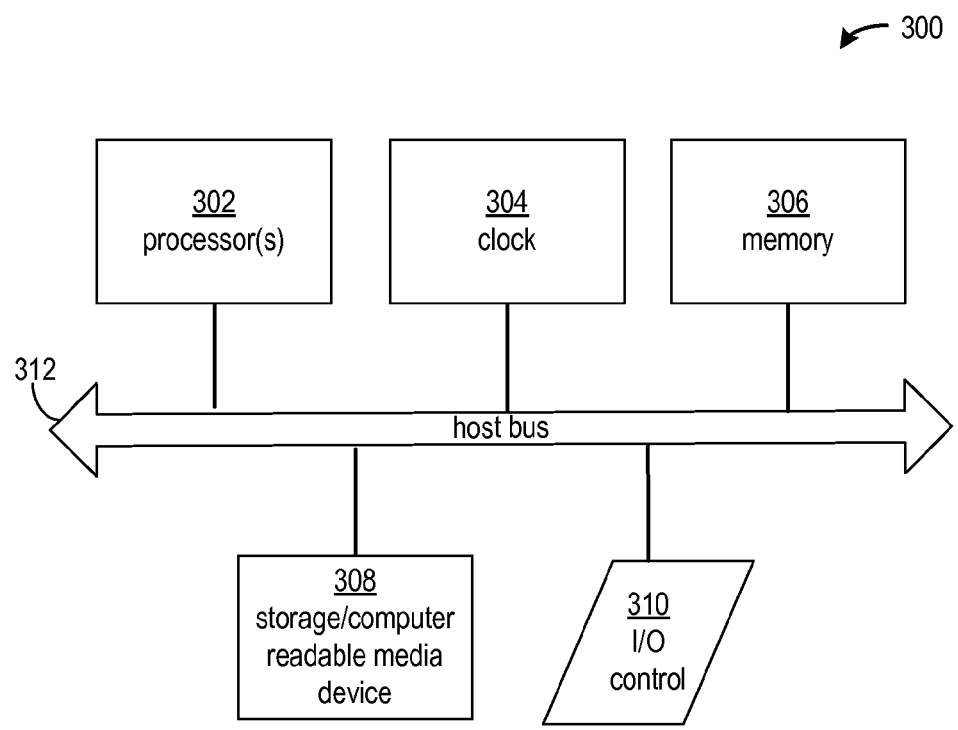
FIG. 3 shows a block diagram of an example computing arrangement that may be configured to implement the data structures and processes described herein.

FIG. 3 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 300 includes one or more processors 302, a clock signal generator 304, a memory arrangement 306, a storage arrangement 308, and an input/output control unit 310, all coupled to a host bus 312. The arrangement 300 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 302 may be one or more general purpose processors, or a combination of one or more general purpose processors and suitable co-processors, or one or more specialized processors (e.g., RISC, CISC, pipelined, etc.).

The memory arrangement 306 typically includes multiple levels of cache memory, and a main memory. The storage arrangement 308 may include local and/or remote persistent storage, such as provided by magnetic disks (not shown), flash, EPROM, or other non-volatile data storage. The storage unit may be read or read/write capable. Further, the memory arrangement 306 and storage arrangement 308 may be combined in a single arrangement.

The processor(s) 302 executes the software in storage arrangement 308 and/or memory arrangement 306, reads data from and stores data to the storage arrangement 308 and/or memory arrangement 306, and communicates with external devices through the input/output control arrangement 310. These functions are synchronized by the clock signal generator 304. The resource of the computing arrangement may be managed by either an operating system (not shown), or a hardware control unit (not shown).

Figure 4:
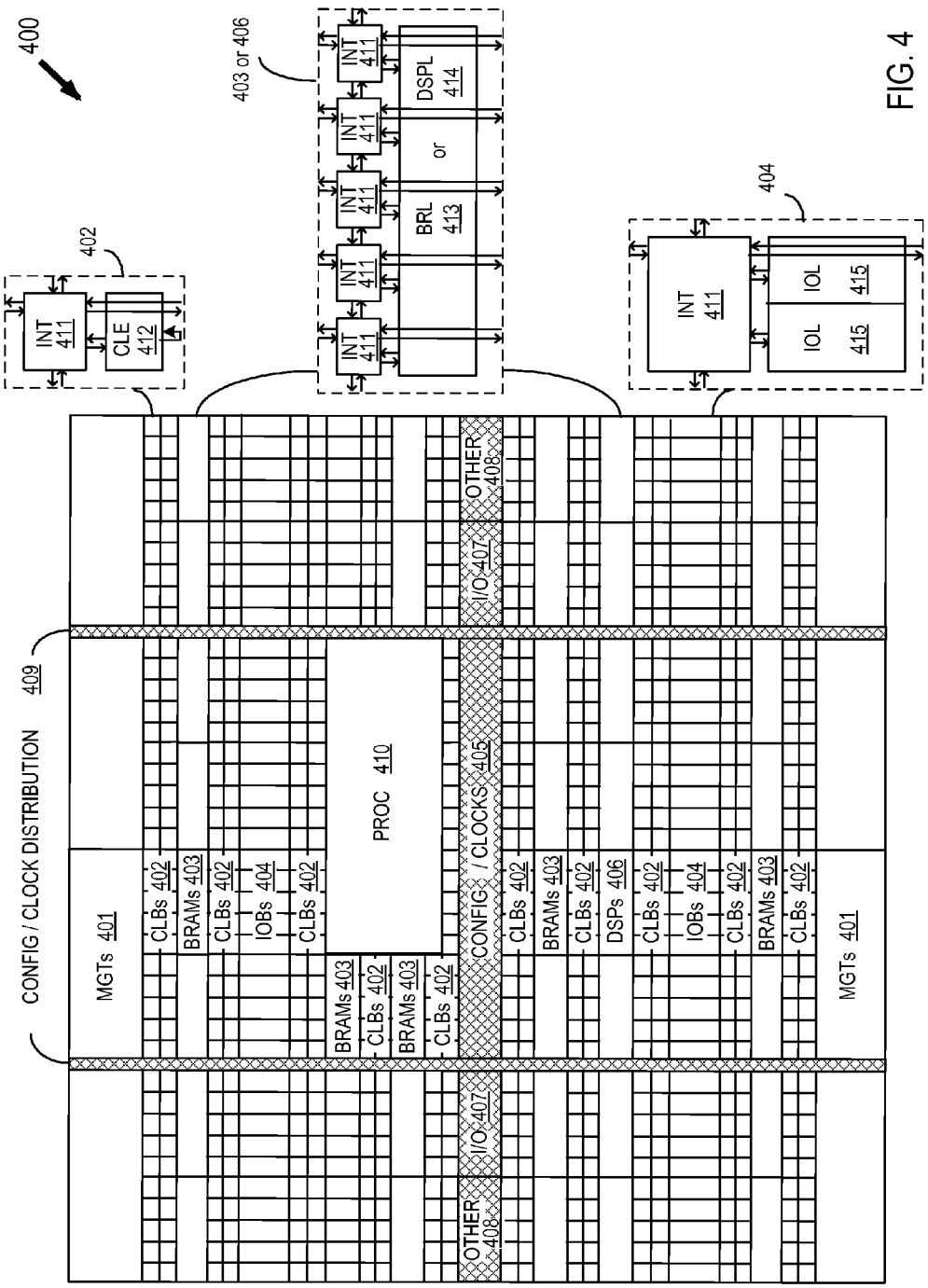
FIG. 4 shows a programmable integrated circuit (IC) that includes a clock network having a programmable frequency multiplier and frequency divider circuits.

FIG. 4 shows a programmable integrated circuit (IC) 400 that includes a clock network having programmable frequency multiplier and frequency divider circuits for which configuration values may be determined using the approaches described herein. The programmable IC may also be referred to as a System On Chip (SOC) that includes field programmable gate array logic (FPGA) along with other programmable resources. FPGA logic may include several different types of programmable logic blocks in the array. For example, FIG. 4 illustrates programmable IC 400 that includes a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized input/output blocks (I/O) 407, for example, clock ports, and other programmable logic 408 such as digital clock managers, analog-to-digital converters, system monitoring logic, and so forth. Some programmable IC having FPGA logic also include dedicated processor blocks (PROC) 410 and internal and external reconfiguration ports (not shown).

In some FPGA logic, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA logic. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic, plus a single programmable interconnect element INT 411. A BRAM 403 can include a BRAM logic element (BRL) 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL) 414 in addition to an appropriate number of programmable interconnect elements. An IOB 404 can include, for example, two instances of an input/output logic element (IOL) 415 in addition to one instance of the programmable interconnect element INT 411. As will be clear to those of skill in the art, the actual I/O bond pads connected, for example, to the I/O logic element 415, are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 4 include additional logic blocks that disrupt the regular columnar structure making up a large part of the programmable IC. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual programmable IC, more than one adjacent column of CLBs is typically included wherever the CLBs appear, to facilitate the efficient implementation of user logic.

The methods and system are thought to be applicable to a variety of systems for determining configuration values for frequency multiplier and frequency divider circuits in a clock network. Other aspects and features will be apparent to those skilled in the art from consideration of the specification. It is intended that the specification and drawings be considered as examples only, with a true scope of the invention being indicated by the following claims.

What is claimed is:

1. A method comprising:
   inputting respective requested frequency values and respective tolerance levels relative to the requested frequency values for a plurality of clocked circuit blocks, each clocked circuit block having a respective clock input port;
   determining by a computer processor, a plurality of solution sets, each solution set including a multiplier value and an associated set of values of divisors, wherein:
   each value of a divisor in each associated set corresponds to one of the clocked circuit blocks,
   an actual frequency value for the corresponding clocked circuit block is a function of an oscillator frequency, the multiplier value, and the value of the divisor, and
   the actual frequency value satisfies the respective tolerance level;
   determining respective sets of clocked error values for the plurality of solution sets, each set of clocked error values including for each clocked circuit block a respective clocked error value that is a function of the respective requested frequency value of the clocked circuit block, the oscillator frequency, the multiplier value, and the value of the divisor corresponding to the clocked circuit block;
   determining for each solution set, a respective solution-set-error value as a function of the respective sets of clocked error values;
   selecting one of the solution sets having a respective solution-set-error value that is less than the respective solution-set-error value of each other of the solution sets; and
   storing the one solution set in a computer-readable storage device.

2. The method of claim 1, further comprising configuring a frequency multiplier circuit and frequency divisor circuits coupled between an oscillator of a programmable IC and the clocked circuit blocks with the multiplier value and values of the divisors from the one solution set for providing clock signals to the clock input ports of the clocked circuit blocks.

3. The method of claim 1, wherein the determining the plurality of solution sets includes, for each solution set:
   selecting for each divisor, one divisor value from a plurality of possible divisor values wherein an absolute difference between an actual frequency that is a function of the oscillator frequency, the multiplier value of the solution set, and the one divisor value, is less than or equal to each other absolute difference between an actual frequency that is a function of the oscillator frequency, the multiplier value of the solution set, and each other of the plurality of possible divisor values.

4. The method of claim 1, wherein the determining the plurality of solution sets includes, for each solution set, selecting one multiplier value from a plurality of possible multiplier values.

5. The method of claim 1, wherein one or more of the solution sets includes values of two or more divisors associated with one of the clocked circuit blocks, and an actual frequency value for the one clocked circuit block is a function of the oscillator frequency, the multiplier value, and the values of the two or more divisors, and the actual frequency satisfies the tolerance level.

6. The method of claim 1, wherein the determining the plurality of solution sets includes:
selecting a candidate multiplier value from a plurality of possible multiplier values;
determining for each of the clocked circuit blocks, whether or not there exists a candidate value of the divisor for which the actual frequency satisfies the tolerance level of the clocked circuit block, wherein the actual frequency is a function of the oscillator frequency, the candidate multiplier value, and the candidate value of the divisor; and
selecting the candidate multiplier value and the candidate values of the divisors as one of the solution sets in response to determining for each of the clocked circuit blocks there exists the candidate value of the divisor for which the actual frequency satisfies the tolerance level of the clocked circuit block.

7. The method of claim 6, wherein the possible multiplier values are restricted to a range.

8. The method of claim 7, wherein the possible values of the divisors are restricted to a range.

9. The method of claim 1, wherein the determining the respective solution-set-error value for each solution set includes summing the clocked error values of the respective set of clocked error values.

10. A method of configuring a programmable integrated circuit (IC), comprising:
inputting respective requested frequency values and respective tolerance levels relative to the requested frequency values for a plurality of clocked circuit blocks, each clocked circuit block having a respective clock input port;
determining by a computer processor, a plurality of solution sets, each solution set including a multiplier value and an associated set of values of divisors, wherein:
respective subsets of each set of values of divisors correspond to the clocked circuit blocks, and each subset includes one or more values of one or more corresponding divisors, and
for each solution set, for each clocked circuit block an actual frequency value that is a function of an oscillator frequency, the multiplier value, and the respective subset of the one or more values of the one or more corresponding divisors, satisfies the respective tolerance level;
determining respective sets of clocked error values for the plurality of solution sets, each set of clocked error values including for each clocked circuit block a respective clocked error value that is a function of the respective requested frequency value of the clocked circuit block, the oscillator frequency, the multiplier value, and the value of the divisor corresponding to the clocked circuit block;

determining for each solution set a respective solution-set-error value as a function of the respective clocked error values;
selecting one of the solution sets having a respective solution-set-error value that is less than the respective solution-set-error value of each other of the solution sets; and
configuring a frequency multiplier circuit and frequency divider circuits coupled between an oscillator of the programmable IC and the clocked circuit blocks with the multiplier value and values of the divisors from the one solution set for providing clock signals to the clock input ports of the clocked circuit blocks.

11. The method of claim 10, wherein the determining the plurality of solution sets includes, for each solution set:
selecting for each divisor in each respective subset, one divisor value from a plurality of possible divisor values wherein an absolute difference between an actual frequency that is a function of the oscillator frequency, the multiplier value of the solution set, and the one divisor value of each divisor in the respective subset, is less than or equal to each other absolute difference between an actual frequency that is a function of the oscillator frequency, the multiplier value of the solution set, and each other of the plurality of possible divisor values of each divisor in the respective subset.

12. The method of claim 10, wherein the determining the plurality of solution sets includes, for each solution set, selecting one multiplier value from a plurality of possible multiplier values.

13. The method of claim 10, wherein the determining the plurality of solution sets includes:
selecting a candidate multiplier value from a plurality of possible multiplier values;
determining for each of the clocked circuit blocks, whether or not there exists a candidate value of each divisor in the respective subset for which the actual frequency satisfies the tolerance level of the clocked circuit block, wherein the actual frequency is a function of the oscillator frequency, the candidate multiplier value, and each candidate value of each divisor; and
selecting the candidate multiplier value and the candidate values of the divisors as one of the solution sets in response to determining for each of the clocked circuit blocks there exists the candidate value of each divisor in the respective subset for which the actual frequency satisfies the tolerance level of the clocked circuit block.

14. The method of claim 13, wherein the possible multiplier values are restricted to a range.

15. The method of claim 11, wherein the possible values of the divisors are restricted to a range.

16. The method of claim 10, wherein the determining the respective solution-set-error value for each solution set includes summing the clocked error values of the respective set of clocked error values.

17. A system, comprising:
a processor;
a memory arrangement coupled to the processor, wherein the memory arrangement is configured with instructions that are executable by the processor for performing operations including:
inputting respective requested frequency values and respective tolerance levels relative to the requested frequency values for a plurality of clocked circuit blocks, each clocked circuit block having a respective clock input port;

determining a plurality of solution sets, each solution set including a multiplier value and an associated set of values of divisors, wherein:
- each value of a divisor in each associated set corresponds to one of the clocked circuit blocks,
- an actual frequency value for the corresponding clocked circuit block is a function of an oscillator frequency, the multiplier value, and the value of the divisor, and
- the actual frequency value satisfies the respective tolerance level;

determining respective sets of clocked error values for the plurality of solution sets, each set of clocked error values including for each clocked circuit block a respective clocked error value that is a function of the respective requested frequency value of the clocked circuit block, the oscillator frequency, the multiplier value, and the value of the divisor corresponding to the clocked circuit block;

determining for each solution set, a respective solution-set-error value as a function of the respective sets of clocked error values;

selecting one of the solution sets having a respective solution-set-error value that is less than the respective solution-set-error value of each other of the solution sets; and storing the one solution set in the memory arrangement.

18. The system of claim 17, wherein the instructions further include instructions that when executed by the processor cause the processor to configure a frequency multiplier circuit and frequency divisor circuits coupled between an oscillator of a programmable IC and the clocked circuit blocks with the multiplier value and values of the divisors from the one solution set for providing clock signals to the clock input ports of the clocked circuit blocks.

19. The system of claim 17, wherein one or more of the solution sets includes values of two or more divisors associated with one of the clocked circuit blocks, and an actual frequency value for the one clocked circuit block is a function of the oscillator frequency, the multiplier value, and the values of the two or more divisors, and the actual frequency satisfies the tolerance level.

20. The system of claim 17, wherein the determining the plurality of solution sets includes:
- selecting a candidate multiplier value from a plurality of possible multiplier values;
- determining for each of the clocked circuit blocks, whether or not there exists a candidate value of the divisor for which the actual frequency satisfies the tolerance level of the clocked circuit block, wherein the actual frequency is a function of the oscillator frequency, the candidate multiplier value, and the candidate value of the divisor; and
- selecting the candidate multiplier value and the candidate values of the divisors as one of the solution sets in response to determining for each of the clocked circuit blocks there exists the candidate value of the divisor for which the actual frequency satisfies the tolerance level of the clocked circuit block.

\* \* \* \* \*